(12) United States Patent
Sugiura

(10) Patent No.: US 10,574,200 B2
(45) Date of Patent: Feb. 25, 2020

(54) TRANSCONDUCTANCE AMPLIFIER

(71) Applicant: ABLIC Inc., Chiba-shi, Chiba (JP)

(72) Inventor: Masakazu Sugiura, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/938,338

(22) Filed: Mar. 28, 2018

(65) Prior Publication Data

US 2018/0287576 A1 Oct. 4, 2018

(30) Foreign Application Priority Data

Mar. 31, 2017 (JP) ................................. 2017-072216

(51) Int. Cl.
*H03F 3/45* (2006.01)

(52) U.S. Cl.
CPC ..... *H03F 3/45183* (2013.01); *H03F 3/45192* (2013.01); *H03F 3/45659* (2013.01); *H03F 3/45748* (2013.01); *H03F 2200/129* (2013.01); *H03F 2200/375* (2013.01); *H03F 2203/45288* (2013.01)

(58) Field of Classification Search
CPC .......... H03F 1/34; H03F 3/45; H03F 3/45183; H03F 3/45479; H03F 3/45565; H03F 3/45659; H03F 2003/45022

USPC .................................................. 330/252–261
See application file for complete search history.

(56) References Cited

U.S. PATENT DOCUMENTS

| 5,621,358 A | * | 4/1997 | Pisati | H03F 3/45286 |
| | | | | 330/253 |
| 6,362,682 B2 | * | 3/2002 | Shulman | H03F 3/45192 |
| | | | | 327/363 |
| 2010/2966600 | | 11/2010 | Ueno et al. | |

FOREIGN PATENT DOCUMENTS

| JP | H05-226950 A | 9/1993 |
| JP | 2005-286822 A | 10/2005 |
| JP | 2010-273009 A | 12/2010 |

* cited by examiner

*Primary Examiner* — Khanh V Nguyen
*Assistant Examiner* — Khiem D Nguyen
(74) *Attorney, Agent, or Firm* — Brinks, Gilson & Lione

(57) ABSTRACT

Provided is a transconductance amplifier including a common-mode feedback circuit that does not affect an operation of the transconductance amplifier. The transconductance amplifier has a transconductance amplifier circuit configured to generate an output current based on an input voltage and a common-mode feedback circuit configured to determine a DC operating point of an output of the transconductance amplifier circuit. The common-mode feedback circuit has a plurality of level shift circuits configured to shift levels of input voltages to output the voltages, and are connected to control terminals of a plurality of transistors.

8 Claims, 4 Drawing Sheets

TRANSCONDUCTANCE AMPLIFIER

RELATED APPLICATIONS

This application claims priority under 35 U.S.C. § 119 to Japanese Patent Application No. 2017-072216 filed on Mar. 31, 2017, the entire content of which is hereby incorporated by reference.

BACKGROUND OF THE INVENTION

1. Field of the Invention

The present invention relates to a transconductance amplifier (hereinafter referred to as "Gm amplifier") including a common-mode feedback circuit configured to determine a DC operating point of an output.

2. Description of the Related Art

A Gm amplifier utilizing differential amplification generally having a high differential mode gain has often a high common mode gain as well. In order to keep the Gm amplifier in a desired operation range, a common-mode feedback circuit configured to determine a DC operating point of an output is used. The DC operating point of the output is sometimes expressed as an output common voltage (for example, Japanese Patent Application Laid-open H05-226950), a DC bias potential (for example, Japanese Patent Application Laid-open 2005-286822), or a common potential (for example, Japanese Patent Application Laid-open 2010-273009).

FIG. 4 is an illustration of an example of a related-art Gm amplifier 200. The Gm amplifier 200 includes, in addition to a main-body Gm amplifier 202, a common-mode feedback circuit 201 configured to determine a DC operating point of the output of the Gm amplifier 202. The common-mode feedback circuit 201 has resistors 211 and 212 and an amplifier 221. The Gm amplifier 202 has transistors 241, 242, 251, and 252, a current source 231, input terminals 281 and 282, and output terminals 291 and 292. The input terminal 281 corresponds to a positive input INP, and the input terminal 282 corresponds to a negative input INN. Similarly, the output terminal 291 corresponds to a positive output OUTP, and the output terminal 292 corresponds to a negative output OUTN.

The input terminals 281 and 282 of the Gm amplifier 202 are connected to gate terminals of the transistors 241 and 242, respectively. Source terminals of the transistors 241 and 242 are connected together to one terminal of the current source 231. Another terminal of the current source 231 is connected to a power supply terminal VDD. A drain terminal of the transistor 241 is connected to the output terminal 292, a drain terminal of the transistor 251, and one terminal of the resistor 211. A drain terminal of the transistor 242 is connected to the output terminal 291, a drain terminal of the transistor 252, and one terminal of the resistor 212. Gate terminals of the transistors 251 and 252 are connected together to an output terminal of the amplifier 221 of the common-mode feedback circuit 201. Source terminals of the transistors 251 and 252 are connected together to VSS. A positive input terminal of the amplifier 221 of the common-mode feedback circuit 201 is connected to a node between the resistor 211 and the resistor 212. A negative input terminal of the amplifier 221 is connected to a reference voltage Vref1.

The operation of the Gm amplifier 202 is described. A voltage of the input terminal 281 is denoted by V(281), and a voltage of the input terminal 282 is denoted by V(282). When an input voltage difference V(281)-V(282) is positive, the bigger the magnitude of the input voltage difference is, the more the transistor 241 is controlled to be off and the transistor 242 is controlled to be on. A larger portion of the current of the current source 231 is distributed to the transistor 242 than to the transistor 241. When the input voltage difference V(281)-V(282) is negative, the bigger the magnitude of the absolute value of the input voltage difference is, the more the transistor 241 is controlled to be on and the transistor 242 is controlled to be off. A large portion of the current of the current source 231 is distributed to the transistor 241 than to the transistor 242.

In this case, when common-mode voltages of the output terminals 291 and 292 of the Gm amplifier 202 increases, a middle-point voltage of the resistors 211 and 212, which are connected between both the terminals, of the common-mode feedback circuit 201 also increases. When the middle-point voltage of the resistors 211 and 212 is larger than Vref1, the amplifier 221 performs control so that the transistors 251 and 252 turn on and the common-mode voltages of the output terminals 291 and 292 decrease. When the middle-point voltage of the resistors 211 and 212 is smaller than Vref1, the amplifier 221 performs control so that the transistors 251 and 252 turn off and the common-mode voltages of the output terminals 291 and 292 increase. In this manner, the common-mode feedback circuit 201 determines the DC operating point of the output of the Gm amplifier 200.

A current source connected to a differential amplifier circuit in the Gm amplifier generally has a high impedance, and hence the gain of the Gm amplifier is reduced when a resistor is connected to the output of the differential amplifier circuit. The reduction of the gain which is supposed to be obtained in design causes increase in input offset voltage of the Gm amplifier or other influences.

SUMMARY OF THE INVENTION

The present invention has been made to provides a Gm amplifier using a common-mode feedback circuit which does not affect the operation of the Gm amplifier.

There is provided a Gm amplifier, including a transconductance amplifier circuit configured to generate an output current based on an input voltage; a common-mode feedback circuit connected to the transconductance amplifier circuit, and configured to determine a DC operating point of an output of the transconductance amplifier circuit; and a plurality of level shift circuits included in the common-mode feedback circuit, and connected to output terminals of the transconductance amplifier circuit, the plurality of level shift circuits being connected to control terminals of a plurality of transistors.

In the common-mode feedback circuit of the present invention absence of resistors, which cause influence to the Gm amplifier as an output load, enables realization of the Gm amplifier using the common-mode feedback circuit which does not affect the operation of the Gm amplifier, thereby giving advantage in preventing the reduction of the gain in the Gm amplifier and further giving advantage in suppressing the increase in input offset voltage of the Gm amplifier.

DETAILED DESCRIPTION OF THE EMBODIMENTS

Now, embodiments of the present invention are described with reference to the drawings.

(First Embodiment)

Figure 1:
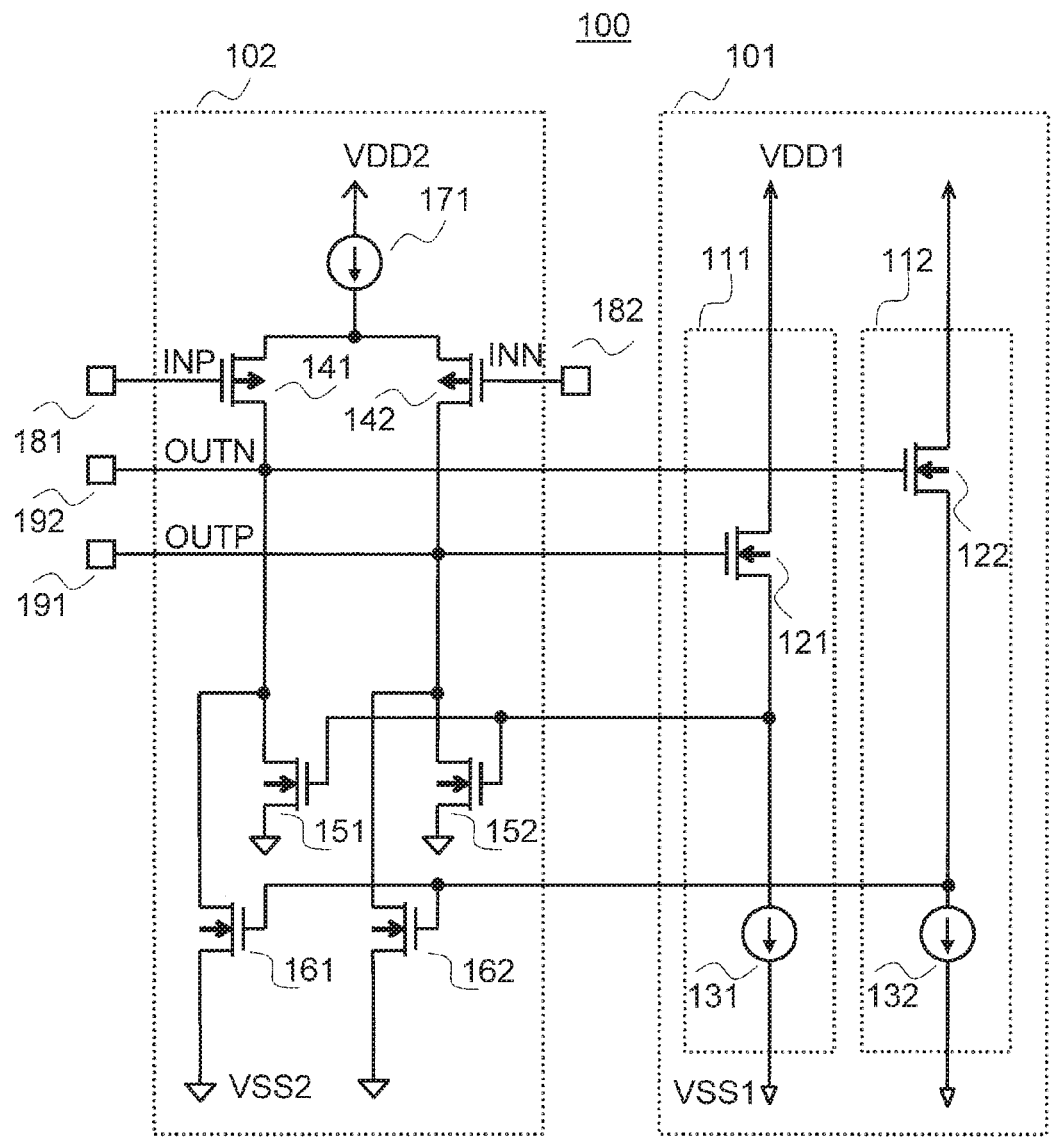
FIG. 1 is an explanatory diagram for illustrating an example of a Gm amplifier according to an embodiment of the present invention.

FIG. 1 is an explanatory diagram for illustrating an example of a Gm amplifier 100 according to a first embodiment of the present invention. The Gm amplifier 100 includes, in addition to a main-body Gm amplifier 102, a common-mode feedback circuit 101 configured to determine a DC operating point of an output of the Gm amplifier 102. The common-mode feedback circuit 101 has level shift circuits 111 and 112. The level shift circuit 111 has a transistor 121 and a current source 131. The level shift circuit 112 has a transistor 122 and a current source 132. The Gm amplifier 102 has transistors 141, 142, 151, 152, 161, and 162, a current source 171, input terminals 181 and 182, and output terminals 191 and 192. The input terminal 181 corresponds to a positive input INP, and the input terminal 182 corresponds to a negative input INN. Similarly, the output terminal 191 corresponds to a positive output OUTP, and the output terminal 192 corresponds to a negative output OUTN.

In the level shift circuit 111, a drain terminal of the transistor 121 is connected to a power supply terminal VDD1. A gate terminal of the transistor 121 is connected to the output terminal 191 of the Gm amplifier 102. A source terminal of the transistor 121 is connected to one terminal of the current source 131 and gate terminals of the transistors 151 and 152 of the Gm amplifier 102. Another terminal of the current source 131 is connected to a power supply terminal VSS1. In the level shift circuit 112, a drain terminal of the transistor 122 is connected to the power supply terminal VDD1. A gate terminal of the transistor 122 is connected to the output terminal 192 of the Gm amplifier 102. A source terminal of the transistor 122 is connected to one terminal of the current source 132 and gate terminals of the transistors 161 and 162 of the Gm amplifier 102. Another terminal of the current source 132 is connected to the power supply terminal VSS1.

In the Gm amplifier 102, one terminal of the current source 171 is connected to a power supply terminal VDD2, and another terminal thereof is connected to source terminals of the transistors 141 and 142. A gate terminal of the transistor 141 is connected to the input terminal 181. A gate terminal of the transistor 142 is connected to the input terminal 182. A drain terminal of the transistor 141 is connected to the output terminal 192, drain terminals of the transistors 151 and 161, and the gate terminal of the transistor 122 of the level shift circuit 112. A drain terminal of the transistor 142 is connected to the output terminal 191, drain terminals of the transistors 152 and 162, and the gate terminal of the transistor 121 of the level shift circuit 111. Source terminals of the transistors 151, 152, 161, and 162 are connected to a power supply terminal VSS2.

The operation of the Gm amplifier 102 is described. A voltage of the input terminal 181 is denoted by V(181), and a voltage of the input terminal 182 is denoted by V(182). When an input voltage difference V(181)-V(182) is positive, the transistor 141 is controlled to turn off and the transistor 142 is controlled to turn on as the magnitude of the input voltage difference is increased. A current of the current source 171 is distributed at a larger ratio to the transistor 142 than to the transistor 141. When the input voltage difference V(181)-V(182) is negative, the transistor 141 is controlled to turn on and the transistor 142 is controlled to turn off as the magnitude of the absolute value of the input voltage difference is increased. A current of the current source 171 is distributed at a larger ratio to the transistor 141 than to the transistor 142.

Since the transistors 151 and 152 which are connected to the drain terminals of the transistors 141 and 142, respectively, have the same gate-source voltage to implement a current-mirror, the transistors 151 and 152 have the same drain current. Similarly, since the transistors 161 and 162 have the same gate-source voltage to implement a current-mirror, the transistors 161 and 162 have the same drain current. Accordingly, a sum of the drain currents of the transistors 151 and 161 which are connected in parallel to the drain terminal of the transistor 141 is equal to a sum of the drain currents of the transistors 152 and 162 which are connected in parallel to the drain terminal of the transistor 142.

As a result, in the Gm amplifier 102, when the input voltage difference V(181)-V(182) is positive, the larger the magnitude thereof is, the larger current flows into the output terminal 192 and flows out of the output terminal 191. Similarly, in the Gm amplifier 102, when the input voltage difference V(181)-V(182) is negative, the smaller the magnitude of the absolute value of the input voltage difference is, the larger current flows into the output terminal 191 and flows out of the output terminal 192.

Meanwhile, the output terminals 191 and 192 of the Gm amplifier 102 are also connected to the level shift circuits 111 and 112, respectively. The level shift circuit 111 has the transistor 121 and the current source 131. This level shift circuit has a typical structure formed of a source follower circuit in which a MOSFET and a current source are inserted in series between the power supply terminals VDD1 and VSS1. A voltage V(191) of the output terminal 191 of the Gm amplifier 102 which is applied to the gate terminal of the transistor 121 is shifted by an amount of a gate-source voltage Vgs by the source follower circuit of the transistor 121 to be supplied as a source voltage of the transistor 121. As the source voltage of the transistor 121 increases, the transistors 151 and 152 are controlled to turn on, and the common-mode voltages of V(191) and V(192) are controlled to decrease. As the source voltage of the transistor 121 decreases, the transistors 151 and 152 are controlled to turn off, and the common-mode voltages of V(191) and V(192) are controlled to increase. The level shift circuit 112 performs a similar operation.

In this manner, the common-mode feedback circuit 101 determines the DC operating point of the output of the Gm amplifier 100.

In the Gm amplifier 100 according to the first embodiment illustrated in FIG. 1, absence of resistors, which cause influence to the Gm amplifier 102 as an output load, in the common-mode feedback circuit 101 enables realization of the Gm amplifier using the common-mode feedback circuit 101 which does not affect the operation of the Gm amplifier, thereby giving advantage in preventing the reduction of the gain in the Gm amplifier 100 and further giving advantage in suppressing the increase in input offset voltage of the Gm amplifier 100.

When the level shift circuit is configured as illustrated in FIG. 1, due to the current sources 131 and 132, gate-source voltages of the transistors 121 and 122 are maintained constant. Even when the output terminal voltages V(191) and V(192) change, charge/discharge of electric charges to/from gate-source capacitors of the transistors 121 and 122 are not performed. This means that the gate-source capacitors of the transistors 121 and 122 do not hinder the operation speed. Thus, the common-mode feedback circuit 101 of the first embodiment has an additional advantage in suppressing the reduction in operation speed of the Gm amplifier 100.

In the description above, the functions of the Gm amplifier 100, the common-mode feedback circuit 101, and the level shift circuits 111 and 112 are described. As long as conditions that enable the functions described here to be exerted are satisfied, specific configurations and specific embodiments thereof are not particularly limited.

Further, in the description above, each of the level shift circuits 111 and 112 has the transistor and the current source. It is apparent that the function is not hindered even when the current source is replaced with a resistor.

Further, in the description above, the outputs of the level shift circuits 111 and 112 are output as source voltages of the transistors 121 and 122, respectively. It is apparent that, even when elements capable of bearing the voltages, for example, PN junctions, saturation-connected transistors, or resistors, are added so that the source voltages pass via the elements to be further reduced and shifted in level, the function is not hindered and the advantages can be obtained similarly.

Further, in the description above, the voltage of the power supply terminal VDD1 of the common-mode feedback circuit 101 and the voltage of the power supply terminal VDD2 of the Gm amplifier 102 may have the same condition or different conditions without any problem. When the voltages have the same condition, rational execution of the operating voltages is possible, and when the voltages have different conditions, power optimization can be obtained.

(Second Embodiment)

Figure 2:
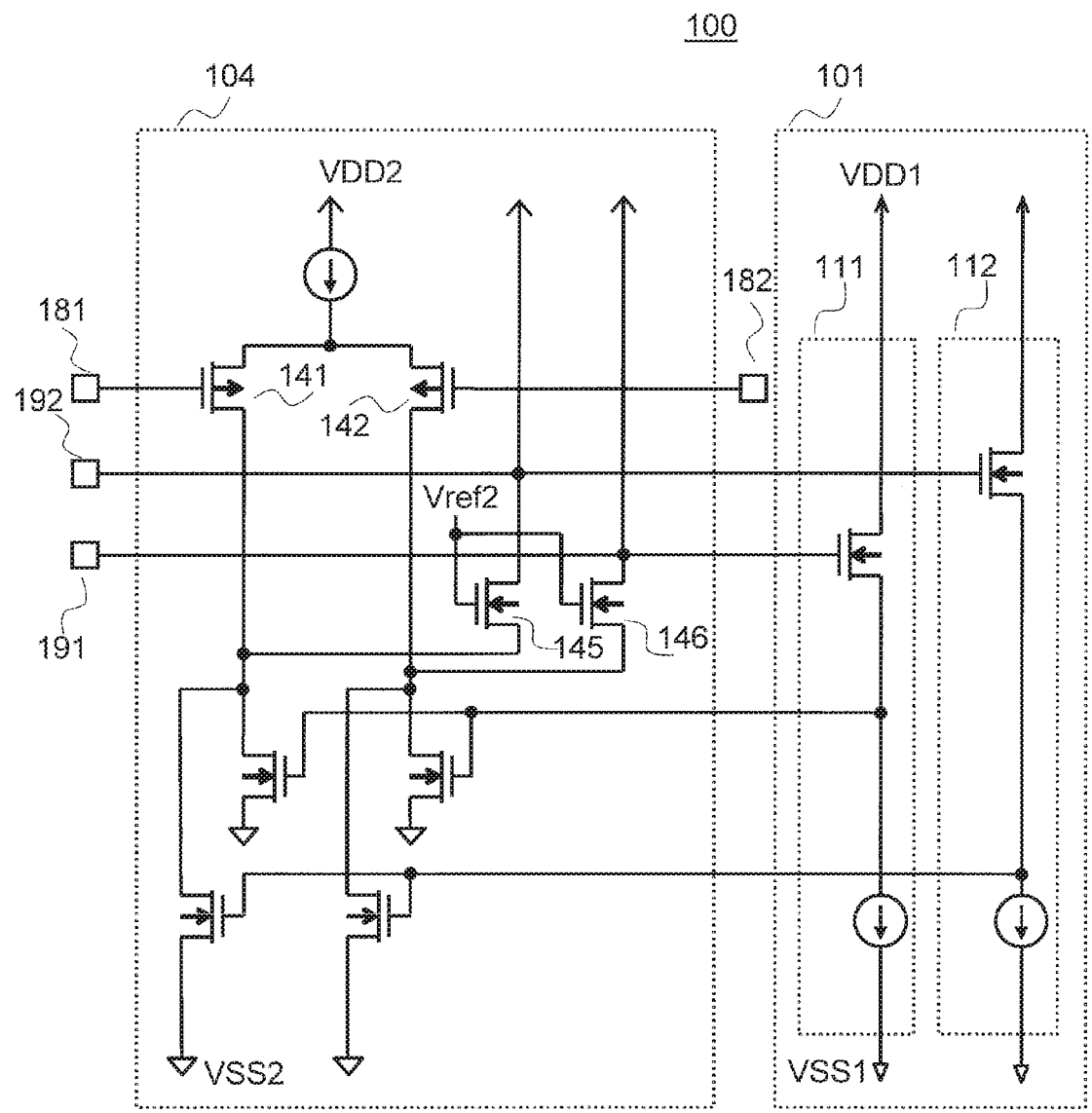
FIG. 2 is an explanatory diagram for illustrating an example of a Gm amplifier according to another embodiment of the present invention.

FIG. 2 is an explanatory diagram for illustrating an example of the Gm amplifier 100 according to a second embodiment of the present invention. The second embodiment is an example in which the common-mode feedback circuit of the first embodiment is combined with a main-body Gm amplifier having a different configuration.

In a main-body Gm amplifier 104 of the second embodiment, transistors 145 and 146 whose gate terminals are biased by a bias voltage Vref2 are added between the output terminals 191 and 192 and the transistors 141 and 142 connected to the input terminals 181 and 182 of the Gm amplifier 104. This corresponds to an example of the Gm amplifier 104 in a so-called folded cascode configuration. The configuration of the common-mode feedback circuit 101 is the same as that of the first embodiment. The power supply conditions are also the same as those of the first embodiment, and the common-mode feedback circuit 101 is connected to the power supply terminal VDD1 and the power supply terminal VSS1. The Gm amplifier 104 is connected to the power supply terminal VDD2 and the power supply terminal VSS2. The Gm amplifier 104 can be described as operating basically similarly to the operation of the Gm amplifier 102 in the first embodiment. In general, since a Gm amplifier having a folded cascode configuration has a high impedance output, a related-art common-mode feedback circuit whose resistor load affects the output cannot be used. When the Gm amplifier has the common-mode feedback circuit having a configuration disclosed in the second embodiment, the DC operating point of the output can be determined without causing reduction in gain.

(Third Embodiment)

Figure 3:
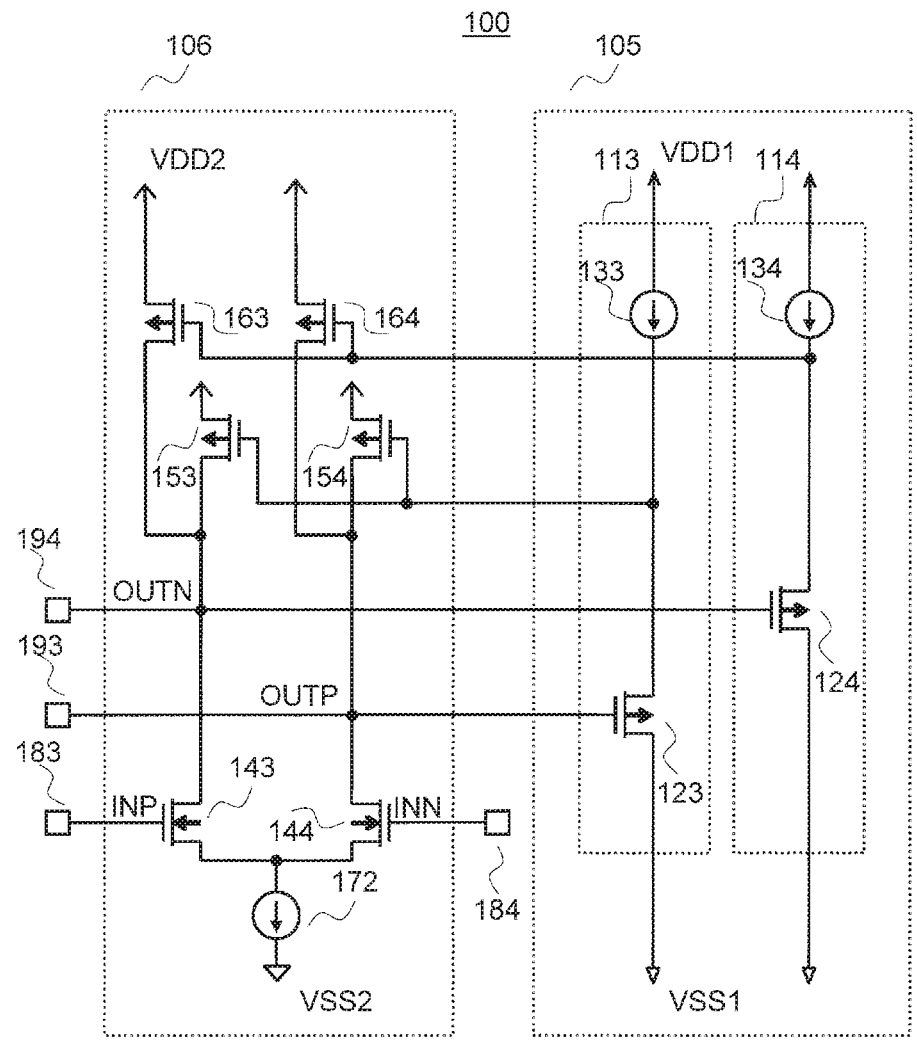
FIG. 3 is an explanatory diagram for illustrating an example of a Gm amplifier according to further another embodiment of the present invention.
Figure 4:
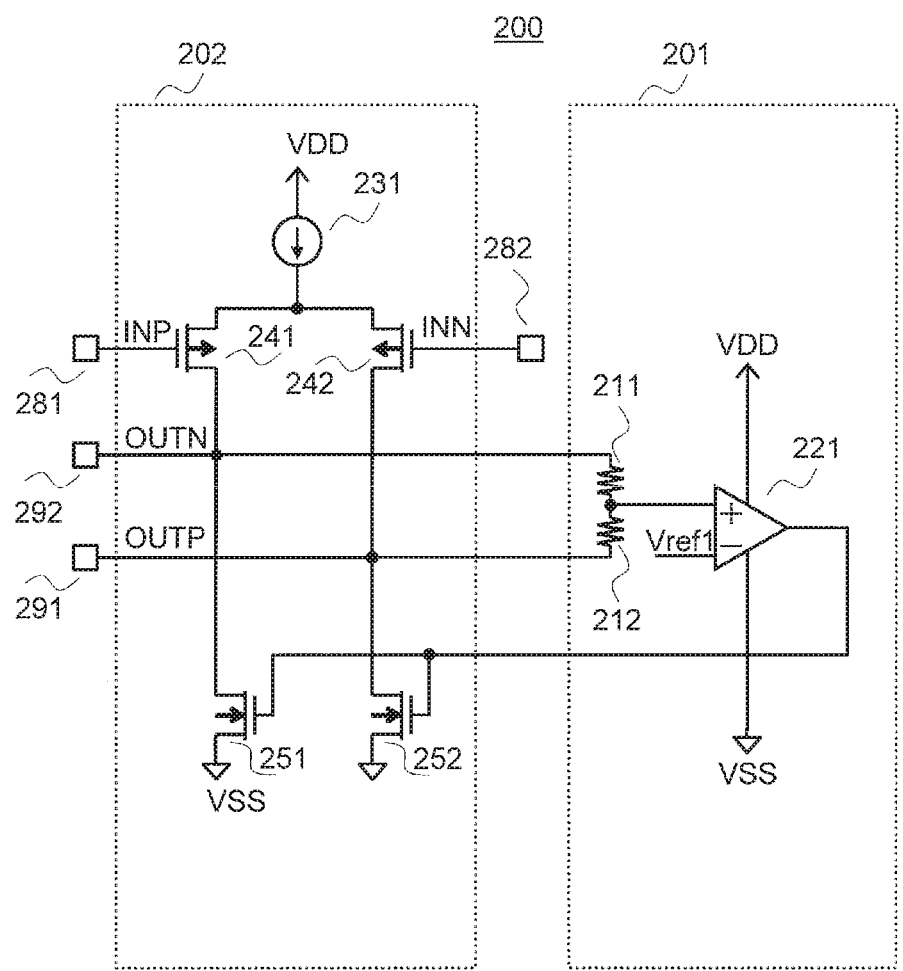
FIG. 4 is an explanatory diagram for illustrating a related-art Gm amplifier.

FIG. 3 is an explanatory diagram for illustrating an example of a common-mode feedback circuit of a third embodiment of the present invention.

The third embodiment differs from the first embodiment in how a common-mode feedback circuit 105 and a main-body Gm amplifier 106 are configured. That is, the third embodiment represents an embodiment in which the function of the common-mode feedback circuit 105 and the function of the Gm amplifier 106 are achieved by a configuration different from that of the first embodiment. The third embodiment is an embodiment in which the Gm amplifier 106 has an NMOS transistor input so that the first embodiment is complementarily reconfigured.

The Gm amplifier 100 includes, in addition to the main-body Gm amplifier 106, the common-mode feedback circuit 105 configured to determine a DC operating point of an output of the Gm amplifier 106. The common-mode feedback circuit 105 has level shift circuits 113 and 114. The level shift circuit 113 has a transistor 123 and a current source 133. The level shift circuit 114 has a transistor 124 and a current source 134. The Gm amplifier 106 has transistors 143, 144, 153, 154, 164, and 164, a current source 172, input terminals 183 and 184, and output terminals 193 and 194. The input terminal 183 corresponds to a positive input INP, and the input terminal 184 corresponds to a negative input INN. Similarly, the output terminal 193 corresponds to a positive output OUTP, and the output terminal 194 corresponds to a negative output OUTN.

In the level shift circuit 113, a drain terminal of the transistor 123 is connected to a power supply terminal VSS1. A gate terminal of the transistor 123 is connected to the output terminal 193 of the Gm amplifier 106. A source terminal of the transistor 123 is connected to one terminal of the current source 133 and gate terminals of the transistors 153 and 154 of the Gm amplifier 106. Another terminal of the current source 133 is connected to a power supply terminal VDD1. In the level shift circuit 114, a drain terminal of the transistor 124 is connected to the power supply terminal VSS1. A gate terminal of the transistor 124 is connected to the output terminal 194 of the Gm amplifier 102. A source terminal of the transistor 124 is connected to one terminal of the current source 134 and gate terminals of the transistors 163 and 164 of the Gm amplifier 106. Another terminal of the current source 134 is connected to the power supply terminal VDD1.

In the Gm amplifier 106, one terminal of the current source 172 is connected to a power supply terminal VSS2, and another terminal thereof is connected to source terminals of the transistors 143 and 144. A gate terminal of the transistor 143 is connected to the input terminal 183. A gate terminal of the transistor 144 is connected to the input terminal 184. A drain terminal of the transistor 143 is connected to the output terminal 194, drain terminals of the transistors 153 and 163, and the gate terminal of the transistor 124 of the level shift circuit 114. A drain terminal of the transistor 144 is connected to the output terminal 193, drain terminals of the transistors 154 and 164, and the gate terminal of the transistor 123 of the level shift circuit 113. Source terminals of the transistors 153, 154, 163, and 164 are connected to a power supply terminal VDD2.

The operation of the third embodiment can be described as being similar to that of the first embodiment.

As described above, in the common-mode feedback circuit of the present invention, absence of resistors, which cause influence to the Gm amplifier as an output load, enables realization of the Gm amplifier using the common-mode feedback circuit which does not affect the operation of the Gm amplifier, thereby giving advantage in preventing the reduction of the gain in the Gm amplifier and further giving advantage in suppressing the increase in input offset voltage of the Gm amplifier. Further, the level shift circuits do not hinder the operation speed, and hence has an advantage in suppressing the reduction in operation speed.

What is claimed is:

1. A transconductance amplifier, comprising:
a transconductance amplifier circuit configured to generate an output current based on an input voltage, the transconductance amplifier circuit comprising:
    a first transistor and a second transistor coupled to a first node of the transconductance amplifier circuit, the first transistor and the second transistor coupled in parallel;
    a third transistor and a fourth transistor coupled to a second node of the transconductance amplifier circuit, the third transistor and the fourth transistor coupled in parallel; and
    a fifth transistor and a sixth transistors configured such that the transconductance amplifier circuit has a folded cascode configuration, wherein:
        the fifth transistor is coupled to the first node at a first side of the fifth transistor, is coupled to a first output terminal at a second side of the fifth transistor, and is coupled to a reference bias voltage at a control terminal of the fifth transistor; and
        the sixth transistor is coupled to the second node at a first side of the sixth transistor, is coupled to a second output terminal at a second side of the sixth transistor, and is coupled to the reference bias voltage at a control terminal of the sixth transistor;
a common-mode feedback circuit connected to the transconductance amplifier circuit, and configured to determine a DC operating point of an output of the transconductance amplifier circuit, the common-mode feedback circuit comprising:
    a first level shift circuit connected to the first output terminal of the transconductance amplifier circuit and connected to control terminals of the first transistor and the third transistor; and
    a second level shift circuit connected to the second output terminal of the transconductance amplifier circuit and connected to control terminals of the second transistor and the fourth transistor.

2. The transconductance amplifier according to claim 1, further comprising current sources controlled by outputs of different level shift circuits, and are connected in parallel to each other.

3. The transconductance amplifier according to claim 1, wherein each of the first level shift circuit and the second level shift circuit has a transistor and a current source.

4. The transconductance amplifier according to claim 1, wherein each of the first level shift circuit and the second level shift circuit has a transistor and a resistor.

5. The transconductance amplifier according to claim 1, wherein the transconductance amplifier circuit and the common-mode feedback circuit have a same operating voltage.

6. The transconductance amplifier according to claim 2, wherein each of the first level shift circuit and the second level shift circuit has a transistor and a current source.

7. The transconductance amplifier according to claim 2, wherein each of the first level shift circuit and the second level shift circuit has a transistor and a resistor.

8. The transconductance amplifier according to claim 2, wherein the transconductance amplifier circuit and the common-mode feedback circuit have a same operating voltage.

* * * * *